(12) United States Patent
Kim

(10) Patent No.: US 11,205,904 B2
(45) Date of Patent: Dec. 21, 2021

(54) ENERGY COLLECTING DEVICE CAPABLE OF REUSING RESIDUAL CHARGE USING VOLTAGE SUPERVISORS

(71) Applicant: CONALOG CO., LTD., Seoul (KR)

(72) Inventor: Eunseo Kim, Seoul (KR)

(73) Assignee: CONALOG CO., LTD., Seoul (KR)

( * ) Notice: Subject to any disclaimer, the term of this patent is extended or adjusted under 35 U.S.C. 154(b) by 242 days.

(21) Appl. No.: 16/691,176

(22) Filed: Nov. 21, 2019

(65) Prior Publication Data
US 2020/0091738 A1 Mar. 19, 2020

Related U.S. Application Data

(63) Continuation of application No. PCT/KR2019/002859, filed on Mar. 12, 2019.

(30) Foreign Application Priority Data

Mar. 15, 2018 (KR) ........................ 10-2018-0030418

(51) Int. Cl.
*H02J 7/00* (2006.01)
*G01R 19/165* (2006.01)
(Continued)

(52) U.S. Cl.
CPC ...... *H02J 7/0024* (2013.01); *G01R 19/16542* (2013.01); *H02J 7/022* (2013.01); *H02N 2/181* (2013.01)

(58) Field of Classification Search
CPC ........ H02J 7/0024; H02J 7/022; H02J 50/001; H02J 7/345; G01R 19/16542; G01R 19/16538; G01R 31/3835; H02N 2/181
(Continued)

(56) References Cited

U.S. PATENT DOCUMENTS 6,323,623 B1 * 11/2001 Someya ................ H02J 7/0021
                                                                320/166
7,138,911 B2    11/2006 Tyndall
(Continued)

FOREIGN PATENT DOCUMENTS

JP   2012023838 A    2/2012
KR   20130133557 A  12/2013
(Continued)

OTHER PUBLICATIONS

Schneider et al., (Schneider), Energy Harvesting and Management of Continuously Powered WSNs, 14th International Multi-conference on Systems,Signals and Devices (SSD) (Year: 2017).*
(Continued)

*Primary Examiner* — M Baye Diao
(74) *Attorney, Agent, or Firm* — Dinsmore & Shohl LLP; Yongsok Choi, Esq.

(57) ABSTRACT

A predetermined internal voltage of a charging and discharging conversion unit is monitored by using voltage supervisor circuits of a voltage monitoring unit in response to a drive voltage for a load to operate such that a connection state of a plurality of capacitors included in the conversion unit is converted to a series connection or a parallel connection in a charging mode or a discharging mode, switching of switching elements of the conversion unit is controlled through switching control signals generated corresponding thereto, and thereby, the plurality of capacitors of the conversion unit are connected in series in the charging mode, and the connection state of the plurality of capacitors is converted and connected in the order of an entire parallel connection, a partial series connection, and an entire series connection in response to the drive voltage for the load to be driven in the discharging mode.

10 Claims, 10 Drawing Sheets

(51) Int. Cl.
*H02J 7/02* (2016.01)
*H02N 2/18* (2006.01)

(58) Field of Classification Search
USPC .......................................................... 320/139
See application file for complete search history.

(56) References Cited

U.S. PATENT DOCUMENTS

| | | | | |
|---|---|---|---|---|
| 7,898,223 B2* | 3/2011 | Takeda | .................... | H02M 3/07 |
| | | | | 320/166 |
| 10,560,035 B2* | 2/2020 | Watanabe | ............... | H02M 7/06 |

FOREIGN PATENT DOCUMENTS

| KR | 101696427 B1 | 1/2017 |
|---|---|---|
| KR | 101753753 B1 | 7/2017 |
| WO | 2010033449 A2 | 3/2010 |

OTHER PUBLICATIONS

International Search Report of PCT/KR2019/002859 dated Jun. 17, 2019.

* cited by examiner

③ EIGHT CAPACITOR

ENERGY COLLECTING DEVICE CAPABLE OF REUSING RESIDUAL CHARGE USING VOLTAGE SUPERVISORS

CROSS-REFERENCE TO RELATED APPLICATION

This application is a continuation of International Patent Application No. PCT/KR2019/002859 filed on Mar. 12, 2019 which claims priority to Korean Patent Application No. 10-2018-0030418 filed on Mar. 15, 2018, the entire contents of which are herein incorporated by reference.

TECHNICAL FIELD

The present invention relates to an energy collecting device, and more specifically, to an energy collecting device capable of reusing residual charges using voltage supervisors that converts a series or parallel connection state of a plurality of capacitors of a charging and discharging conversion unit on the basis of a predetermined voltage monitored by the voltage supervisors in response to a drive voltage for a load to operate such that electric charges remaining in each capacitor can be reused to the maximum.

BACKGROUND ART

Recently, there is a growing interest in a wireless switch capable of wirelessly outputting a control signal without using a temporary power supply such as a battery. The wireless switch is also referred to as a batteryless wireless switch (BWS), and since the wireless switch does not require a separate battery or a power supply line for operation of the switch, the wireless switch can reduce installation and maintenance costs. Such a wireless switch typically adopts a method of collecting electrical energy from a piezoelectric element and adopts a method of rectifying the electrical energy generated by pressing the piezoelectric element, collecting the rectified energy, and transmitting the collected energy to an RF transmission circuit through a regulator. However, this process can result in a significant energy loss, and thus, a configuration capable of minimizing the energy loss is required.

In this regard, Korean Patent No. 10-1696427 discloses an energy collecting device including a piezoelectric element switch, a bias flip rectifier, a charging/discharging conversion unit, a controller, and a regulator, and a wireless switch using the same as a prior art document. The conventional energy collection device disclosed in the prior art document includes the charging and discharging conversion unit configured by only a diode and a capacitor without a separate switching control technique, and in this case, energy loss by multiple diodes occurs when the capacitors are charged, and an effective capacitance viewed in a direction of a capacitor array is smaller than an actual capacitance due to the diode, and thereby, electronic charges in each capacitor in the array are not evenly charged, resulting in additional energy loss in the discharging mode, and particularly, in a case where a voltage of the capacitor is lower than a minimum operation voltage of a regulator (or a DC-DC converter) or a load application in the discharging mode, efficiency is reduced or energy corresponding to the residual charges are abandoned. That is, in a case of the energy collecting device of the prior art document, a bias flip rectifier including a bridge rectifier, an inductor, and a switching element is used to improve efficiency of energy transfer at the front stage of the charging and discharging conversion unit, and there is a problem that a timing control of a bias flip is difficult and a circuit configuration of the charging and discharging conversion unit is also complicated.

Further, Korean Patent No. 10-1753753 discloses an energy harvester using a piezoelectric element including a piezoelectric element, a motion sensing unit, a control signal generation unit, a regulator, and a load as a prior art document. The energy harvester using the piezoelectric element of the prior art document collects an electrical energy output from the piezoelectric element according to operations of a plurality of switching elements in the regulator and transfers the collected energy to a load, and if a motion detection unit detects a change in a state of a voltage output from the piezoelectric element, the control signal generation unit generates a control signal for switching the switching element on the basis of the detection signal generated by the motion detection unit. Accordingly, an energy transfer efficiency is increased based by relying on a circuit whose timing has to be accurately controlled but there are problems that timing of the circuit is difficult to control and particularly, in a case where timing of a control signal is shifted, an FSM (Finite State Machine) is in a wrong state or the efficiency is suddenly reduced.

SUMMARY

Technical Problem

The present invention is proposed to solve the above-described problems of the conventionally proposed method, and an object of the present invention is to provide an energy collecting device capable of reusing residual charges using voltage supervisors which monitors an predetermined internal voltage of a charging and discharging conversion unit by using voltage supervisor circuits of a voltage monitoring unit in response to a drive voltage for a load to operate such that a connection state of a plurality of capacitors included in the charging and discharging conversion unit is converted to a series connection or a parallel connection in a charging mode or a discharging mode, controls switching of switching elements of the charging and discharging conversion unit through switching control signals generated corresponding thereto, and thereby, the plurality of capacitors of the charging and discharging conversion unit are connected in series in the charging mode, and the connection state of the plurality of capacitors is converted and connected in one of an entire parallel connection, a partial series connection, and an entire series connection in response to the drive voltage for the load to be driven in the discharging mode, and thus, residual charges in each capacitor can be reused to the maximum in response to the drive voltage of the load.

Further, another object of the present invention is to provide an energy collecting device capable of reusing residual charges using voltage supervisors in which the residual charges in each capacitor can be reused as the drive voltage for the load to be driven to the maximum by switching and converting a series or parallel connection state of the plurality of capacitors of the charging and discharging conversion unit on the basis of a predetermined voltage monitored by a voltage supervisor in response to the drive voltage for the load to operate, and thus, it is possible to improve use of electric charges that cannot be used due to not being appropriate for the drive voltage of the load and to enable a long term use.

In addition, still another object of the present invention is to provide an energy collecting device capable of reusing residual charges using voltage supervisors in which by controlling switching of the switching elements by monitoring an predetermined internal voltage of the charging and discharging conversion unit by using the voltage supervisor circuit of the voltage monitoring unit, it is possible to prevent the switching elements to be damaged, to enable a reliable circuit operation due to insensitivity to timing of the switching control, to configure a circuit with small hardware costs of a configuration circuit, and to enable low costs because a low-cost commercial device can be configured.

Solution to Problem

An energy collecting device capable of reusing residual charges using voltage supervisors according to characteristics of the present invention for achieve the above-described objects as an energy collecting device capable of reusing residual charges using voltage supervisors, includes a piezoelectric element unit that generates an alternating current according to a pressing operation of a user; a rectification unit that rectifies the alternating current generated from the piezoelectric element unit into a direct current and outputs the direct current; a charging and discharging conversion unit that includes a plurality of capacitors for charging and discharging an output voltage output from the rectification unit and a plurality of switching elements and converts a connection state of the plurality of capacitors into a series or parallel connection according to switching of the plurality of switching elements to adjust charging and discharging of energy; a power transfer switching unit that is connected to an output terminal of the charging and discharging conversion unit and is switched to a discharging mode according to a discharging mode switching signal; a regulator that converts an output voltage transmitted in a switching mode of the discharging mode of the power transfer switching unit and outputs the output voltage to a load; and a voltage monitoring unit including a plurality of voltage supervisor circuits that control switching of the plurality of switching elements in order to adjust charging and discharging of the plurality of capacitors included in the charging and discharging conversion unit, each monitor a predetermined internal voltage of the charging and discharging conversion unit, and each output switching control signals on the basis of the monitored predetermined voltage. In the charging and discharging conversion unit, all the plurality of capacitors are connected in series on the basis of the switching control signals of the plurality of voltage supervisor circuits of the voltage monitoring unit, in a charging mode of the plurality of capacitors, and the connection state of the plurality of capacitors is converted and connected in an order of an entire parallel connection, a partial series connection, and an entire series connection on the basis of the switching control signals of the plurality of voltage supervisor circuits of the voltage monitoring unit corresponding to a drive voltage for the load to operate in the discharging mode of the plurality of capacitors.

Preferably, the charging and discharging conversion unit may be configured to increase the plurality of capacitors by a multiple of 2.

Preferably, the charging and discharging conversion unit may be configured to include first to fourth capacitors connected in parallel to an output terminal of the rectification unit; first to third diodes that are interposed between the output terminal of the rectification unit and the second to fourth capacitors respectively connected in parallel to the output terminal of the rectification unit and are connected in series to the second and fourth capacitors respectively; a first switching element that is connected to a connection node between the other terminal of the first capacitor and a fourth diode connected in series to the other terminal of the first capacitor and a connection node between the first diode and the second capacitor, and is switched according to a first switching control signal of the voltage monitoring unit; a second switching element that is connected to a connection node between the other terminal of the second capacitor and a fifth diode connected in series to the other terminal of the first capacitor and a connection node between the second diode and the third capacitor, and is switched according to a second switching control signal of the voltage monitoring unit; a third switching element that is connected to a connection node between the other terminal of the third capacitor and a sixth diode connected in series to the other terminal of the third capacitor and a connection node between the third diode and the fourth capacitor, and is switched according to the first switching control signal of the voltage monitoring unit; and a resistor that is connected to a connection node between a gate terminal of the first switching element and a control signal bridge unit and a connection node between the second diode and the third capacitor.

More preferably, each of the first to third switching elements may be configured with a MOSFET (Metal-Oxide Semiconductor Field Effect Transistor) and is configured with one of a P-ch MOSFET and an N-ch MOSFET.

More preferably, the voltage monitoring unit may be configured to include a first voltage supervisor circuit that monitors a voltage state of a connection node point, which is connected to the third switching element, between the third diode and the fourth capacitor and outputs the first switching control signal to the first switch and the third switch on the basis of the monitored voltage state; and a second voltage supervisor circuit that monitors a voltage state of a connection node point, which is connected to the second switching element, between the second diode and the third capacitor and outputs the second switching control signal to the second switch on the basis of the monitored voltage state.

More preferably, in the voltage monitoring unit, the first and second voltage supervisor circuits may output first and second switching control signals for switching control of the first to third switching elements, respectively, and the first and second switching control signals may control signals having no great difference from each gate voltage and each drain voltage of the first to third switching elements and function to prevent the switching elements from being damaged.

More preferably, the first and second voltage supervisor circuits of the voltage monitoring unit may be configured to generate the first and second signals respectively on the basis of an predetermined internal voltage monitored by the charging and discharging conversion unit and function to be capable of a reliable circuit operation due to insensitivity to timing.

More preferably, the discharging mode switching signal EN may be realized by one of an input terminal and an output terminal of the regulator, an application of a load, and an output of an additional voltage supervisor circuit that monitors a voltage of the fourth capacitor of the charging and discharging conversion unit to a low threshold. The energy collecting device capable of reusing residual charges using the voltage supervisors, wherein the charging and discharging conversion unit 130 is configured to include a first switching element M1 that is switched according to a first switching control signal S1 of the voltage monitoring unit 160; a second switching element M2 that is connected to a connection node between the other terminal of the second capacitor C2 and an terminal of the third capacitor C3, and is switched according to a second switching control signal S2 of the voltage monitoring unit 160; a third switching element M3 that is connected to a connection node between the other terminal of the third capacitor C3 and an terminal of the fourth capacitor C4, and is switched according to the first switching control signal S1 of the voltage monitoring unit 160; and a control signal bridge unit BU that is connected to a gate terminal of the first switching element M1 for transferring the first switching control signal S1 and includes a resistor R that is connected to a connection node between a gate terminal of the first switching element M1 and an terminal of the third capacitor C3, wherein the resistor R makes a voltage of an terminal of the third capacitor C3 be identical with a basic bias voltage of the gate terminal of the first switching element M1.

Advantageous Effects of Invention

According to an energy collecting device capable of reusing residual charges using voltage supervisors proposed in the present invention, an predetermined internal voltage of a charging and discharging conversion unit is monitored by using voltage supervisor circuits of a voltage monitoring unit in response to a drive voltage for a load to operate such that a connection state of a plurality of capacitors included in the charging and discharging conversion unit is converted to a series connection or a parallel connection in a charging mode or a discharging mode, switching of switching elements of the charging and discharging conversion unit is controlled through switching control signals generated corresponding thereto, and thereby, the plurality of capacitors of the charging and discharging conversion unit are connected in series in the charging mode, and the connection state of the plurality of capacitors is converted and connected in the order of an entire parallel connection, a partial series connection, and an entire series connection in response to the drive voltage for the load to be driven in the discharging mode, and thus, residual charges in each capacitor can be reused to the maximum in response to the drive voltage of the load.

Further, according to the present invention, residual charges in each capacitor can be reused as a drive voltage for a load to be driven to the maximum by switching and converting a series or parallel connection state of a plurality of capacitors of a charging and discharging conversion unit on the basis of a predetermined voltage monitored by a voltage supervisor in response to the drive voltage for the load to operate, and thus, it is possible to improve use of electric charges that cannot be used due to not being appropriate for the drive voltage of the load and to enable a long term use.

In addition, according to the present invention, by controlling switching of the switching elements by monitoring an predetermined internal voltage of the charging and discharging conversion unit by using the voltage supervisor circuit of the voltage monitoring unit, it is possible to prevent the switching elements to be damaged, to enable a reliable circuit operation due to insensitivity to timing of the switching control, to configure a circuit with small hardware costs of a configuration circuit, and to enable low costs because a low-cost commercial device can be configured.

DETAILED DESCRIPTION

Figure 1:
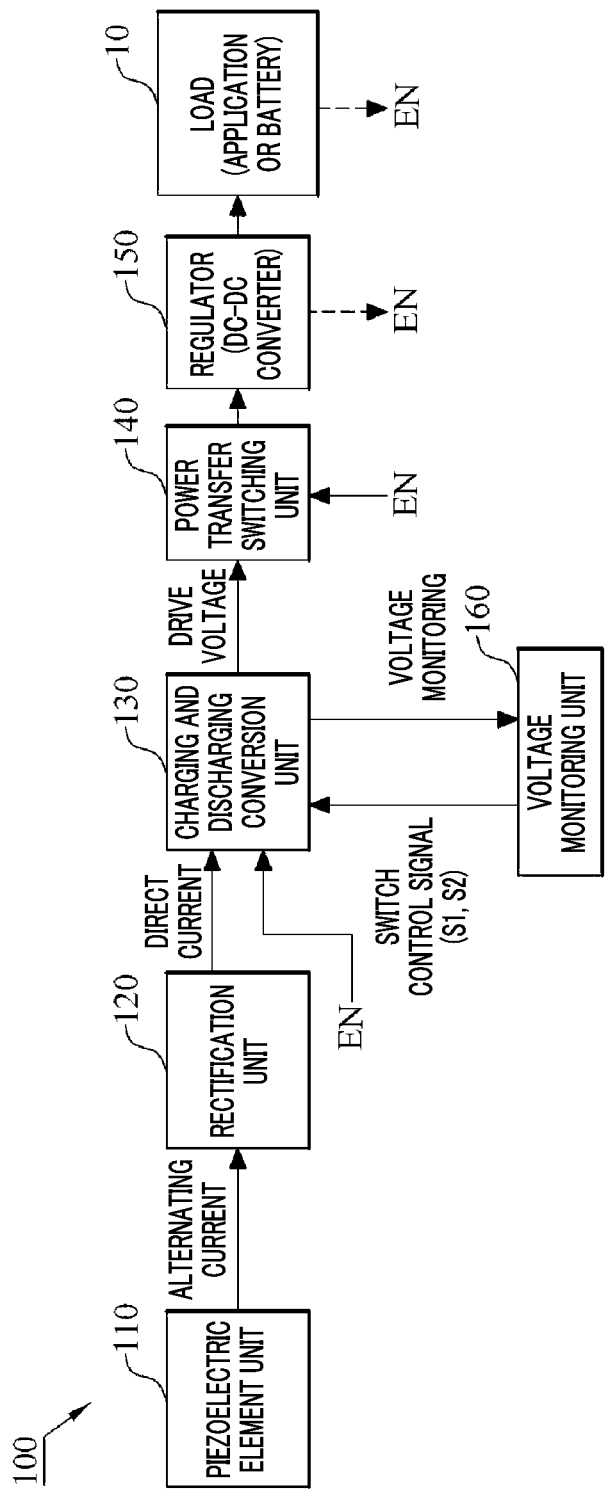
FIG. 1 is a functional block diagram illustrating a configuration of an energy collecting device capable of reusing residual charges using voltage supervisors according to an embodiment of the present invention.

Hereinafter, preferred embodiments will be described in detail with reference to the accompanying drawings such that those skilled in the art may easily implement the present invention. However, in describing the preferred embodiment of the present invention in detail, in a case where it is determined that specific description on a related known function or configuration may unnecessarily obscure a subject matter of the present invention, detailed description thereof will be omitted. Further, the same reference numeral is used for a portion having similar function and action throughout the drawings.

In addition, throughout the specification, when a portion is "connected" to another portion, which includes not only a case where the portion is "directly connected" but also a case where the portion is "indirectly connected" with another element therebetween. Further, the term "including" a certain configuration element means that another configuration element is not excluded and may be further included unless described otherwise.

Figure 2:
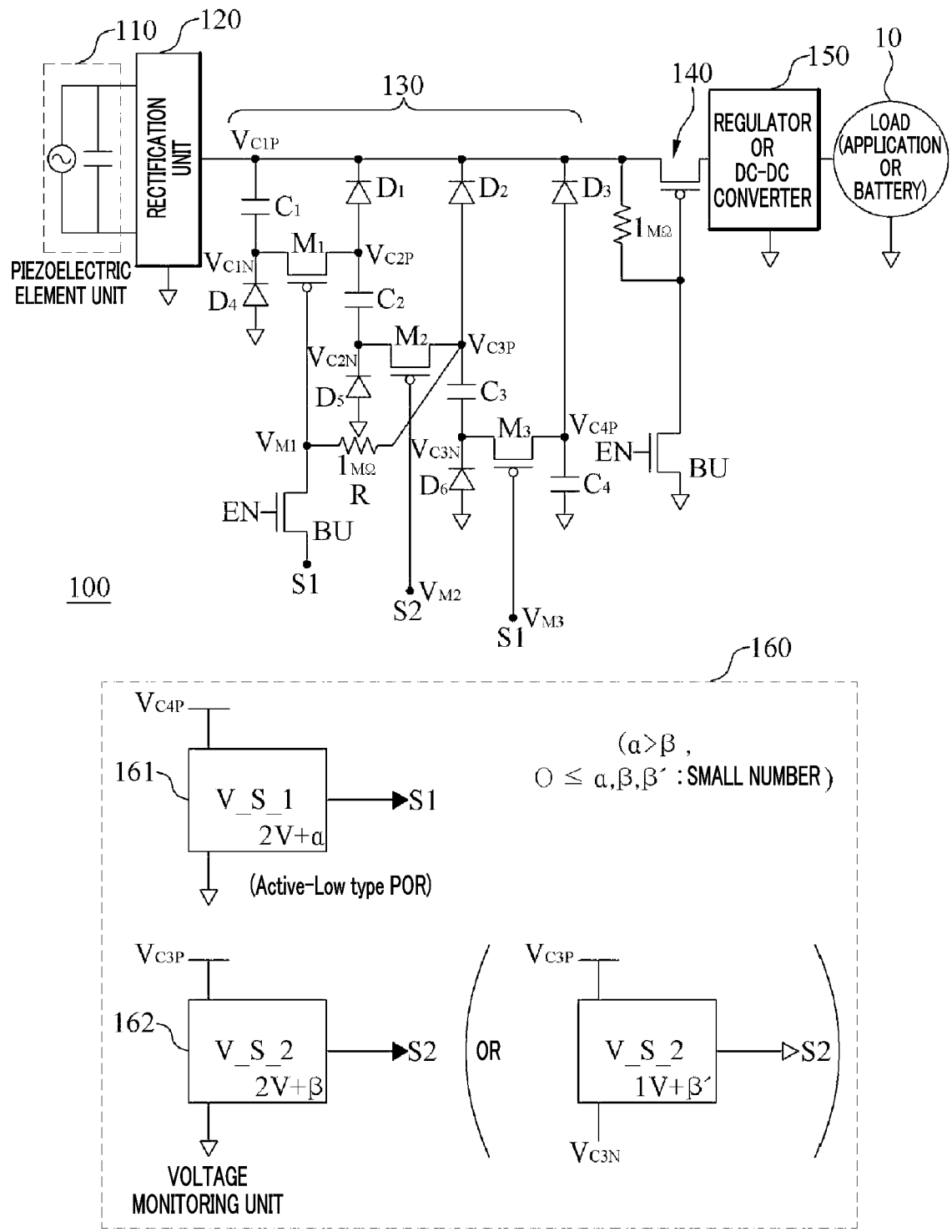
FIG. 2 is a diagram illustrating a circuit configuration of the energy collecting device capable of reusing residual charges using the voltage supervisors according to the embodiment of the present invention.
Figure 3:
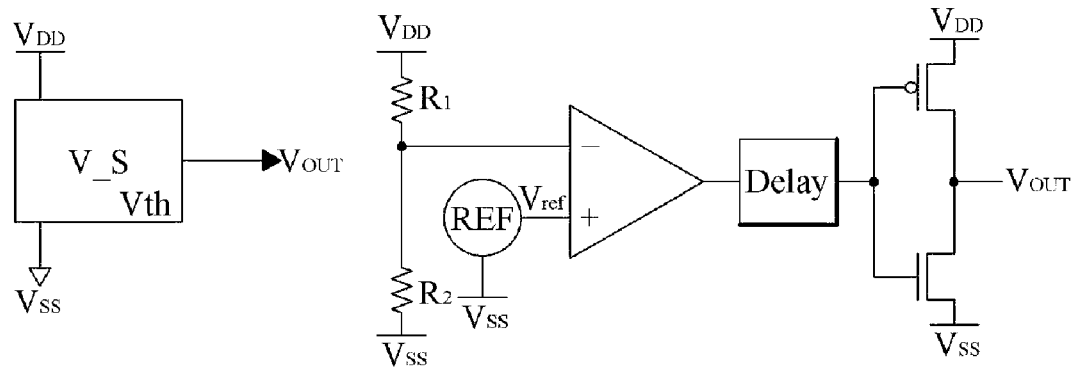
FIG. 3 is a diagram illustrating a circuit configuration of an example of the voltage supervisor circuit applied to the energy collecting device capable of reusing residual charges using the voltage supervisors according to the embodiment of the present invention.
Figure 4A:
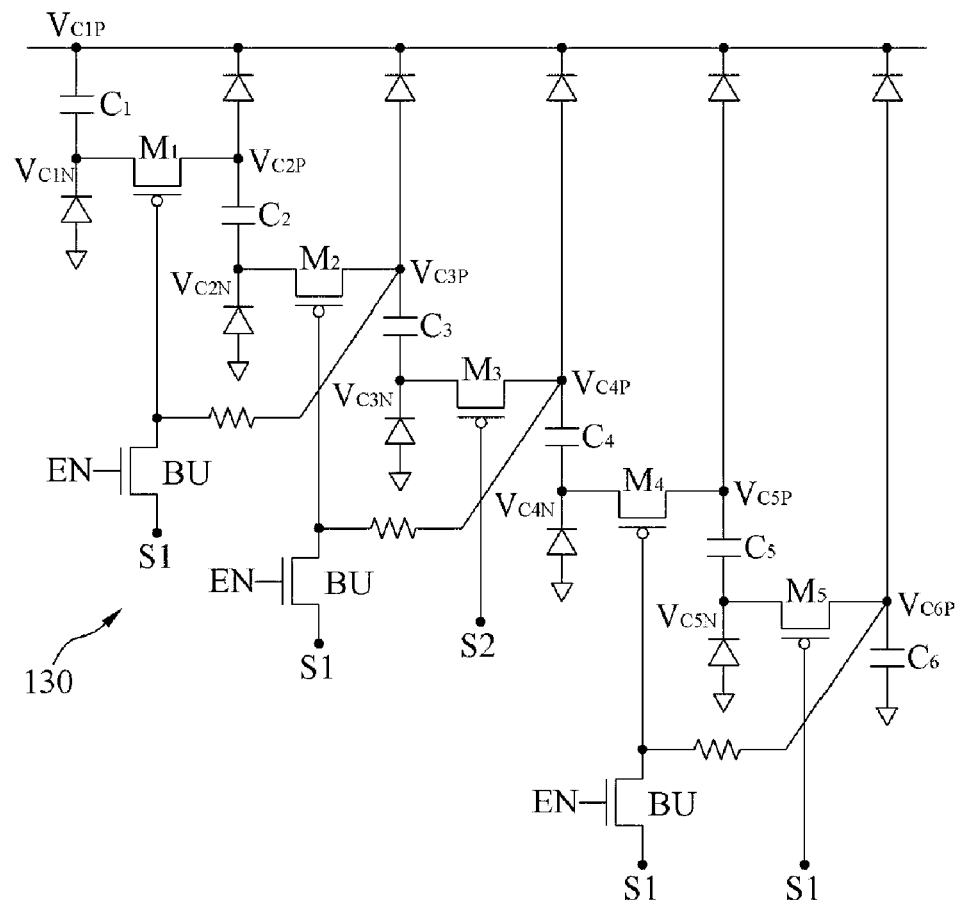
FIG. 4A is a diagram illustrating a circuit configuration of one modification example of a charging and discharging conversion unit applied to the energy collecting device capable of reusing residual charges using the voltage supervisors according to the embodiment of the present invention.
Figure 4B:
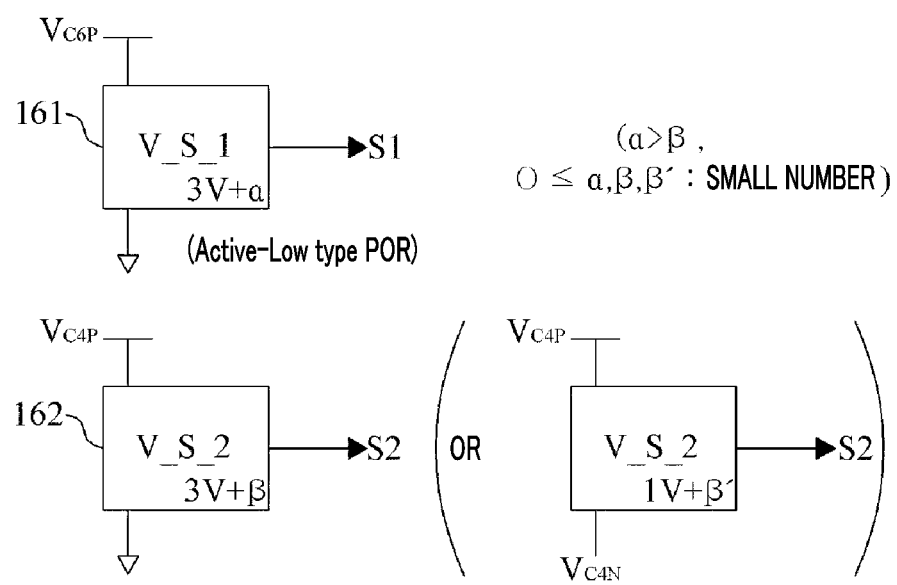
FIG. 4B is a diagram illustrating a circuit configuration of one modification example of a charging and discharging conversion unit applied to the energy collecting device capable of reusing residual charges using the voltage supervisors according to the embodiment of the present invention.
Figure 5A:
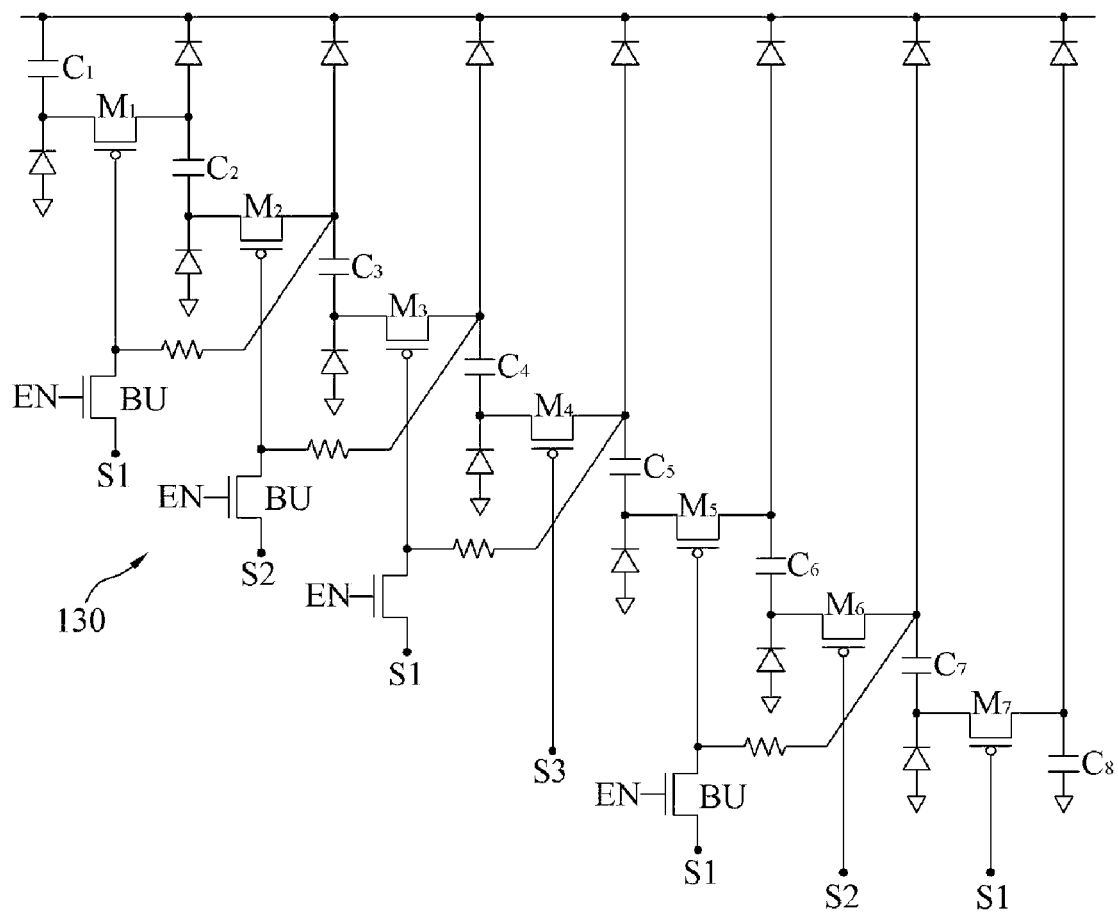
FIG. 5A is a diagram illustrating a circuit configuration of another modification example of the charging and discharging conversion unit applied to the energy collecting device capable of reusing residual charges using the voltage supervisors according to the embodiment of the present invention.
Figure 5B:
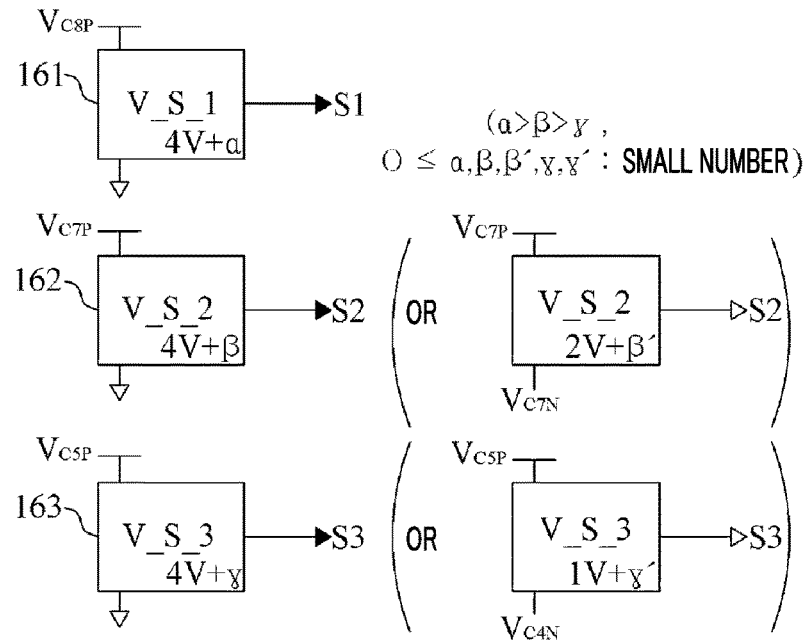
FIG. 5B is a diagram illustrating a circuit configuration of another modification example of the charging and discharging conversion unit applied to the energy collecting device capable of reusing residual charges using the voltage supervisors according to the embodiment of the present invention.
Figure 6A:
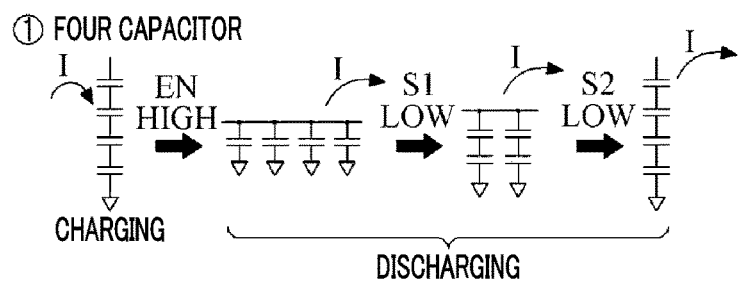
FIG. 6A is a diagram illustrating a connection state of a capacitor array provided in the charging and discharging conversion unit applied to the energy collecting device capable of reusing residual charges using the voltage supervisors according to the embodiment of the present invention.
Figure 6B:
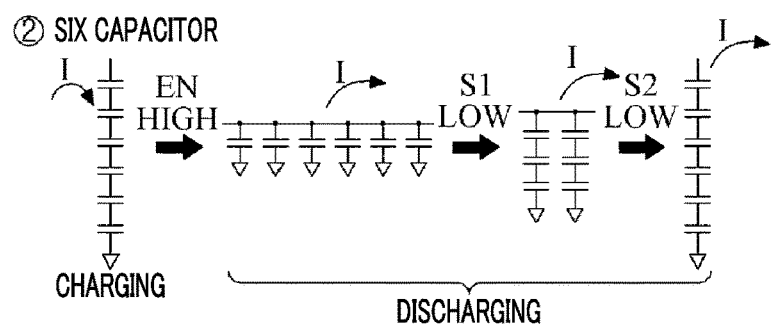
FIG. 6B is a diagram illustrating a connection state of a capacitor array provided in the charging and discharging conversion unit applied to the energy collecting device capable of reusing residual charges using the voltage supervisors according to the embodiment of the present invention.
Figure 6C:
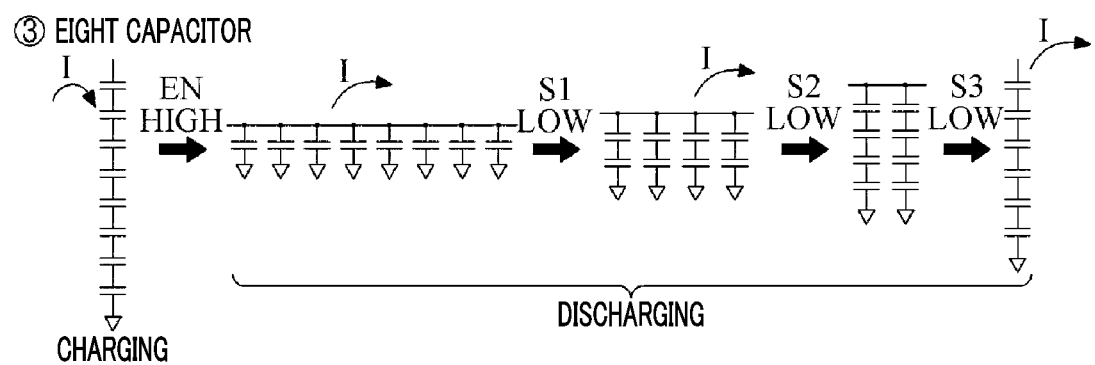
FIG. 6C is a diagram illustrating a connection state of a capacitor array provided in the charging and discharging conversion unit applied to the energy collecting device capable of reusing residual charges using the voltage supervisors according to the embodiment of the present invention.
Figure 7:
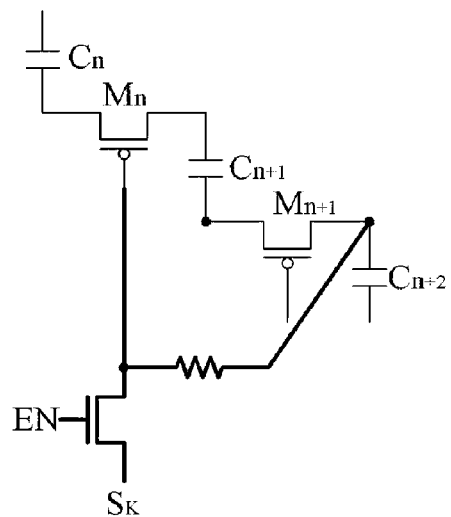
FIG. 7 is a diagram illustrating an example of a configuration of a control signal bridge unit applied to the energy collecting device capable of reusing residual charges using the voltage supervisors according to the embodiment of the present invention.
Figure 8A:
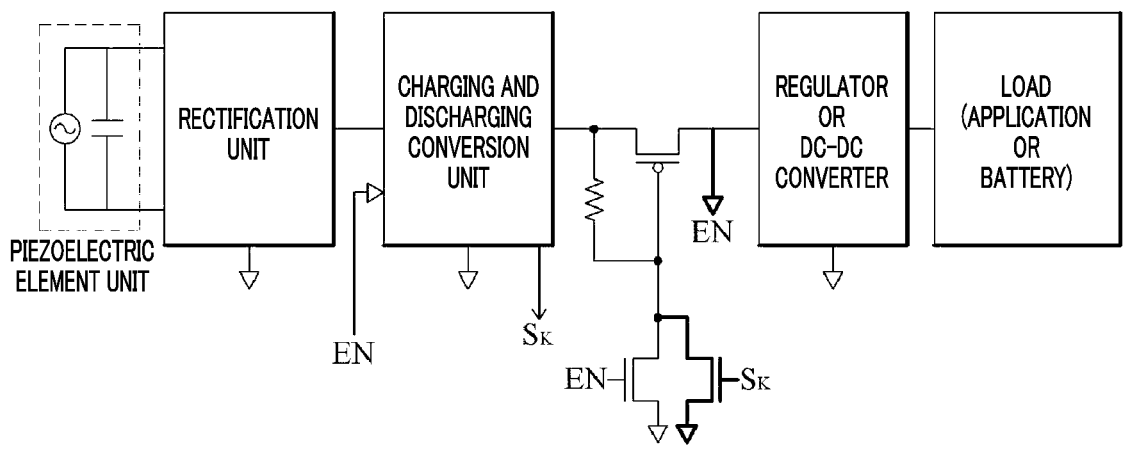
FIG. 8A is a diagram illustrating an example of a method of generating a discharging mode switch signal of the energy collecting device capable of reusing residual charges using the voltage supervisors according to the embodiment of the present invention.
Figure 8B:
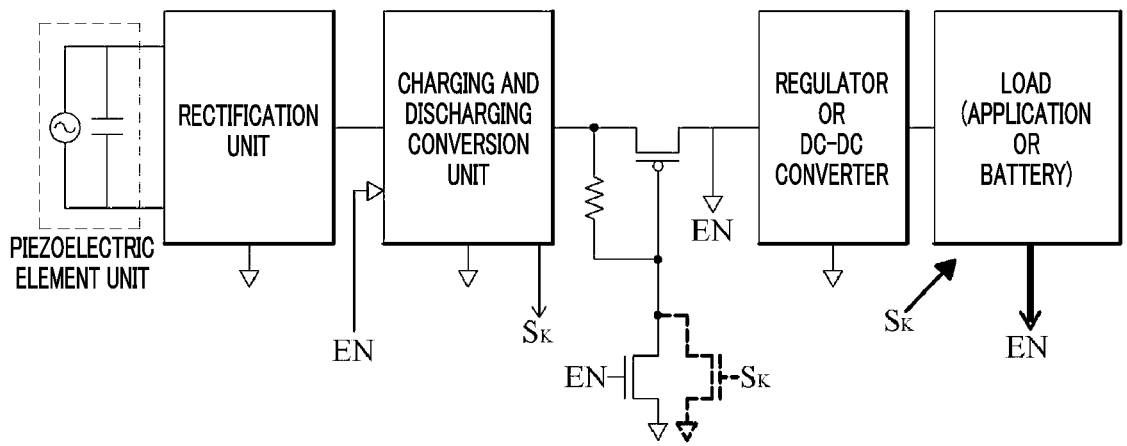
FIG. 8B is a diagram illustrating an example of a method of generating a discharging mode switch signal of the energy collecting device capable of reusing residual charges using the voltage supervisors according to the embodiment of the present invention.
Figure 8C:
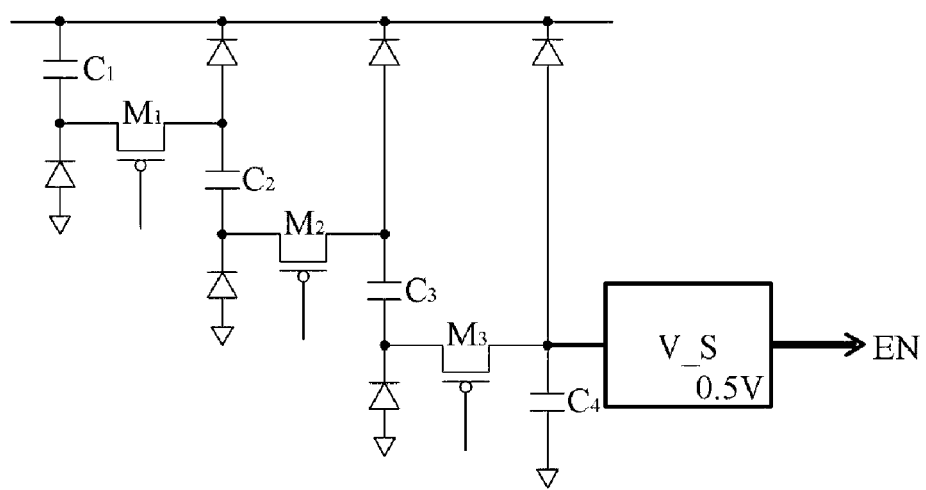
FIG. 8C is a diagram illustrating an example of a method of generating a discharging mode switch signal of the energy collecting device capable of reusing residual charges using the voltage supervisors according to the embodiment of the present invention.
Figure 9:
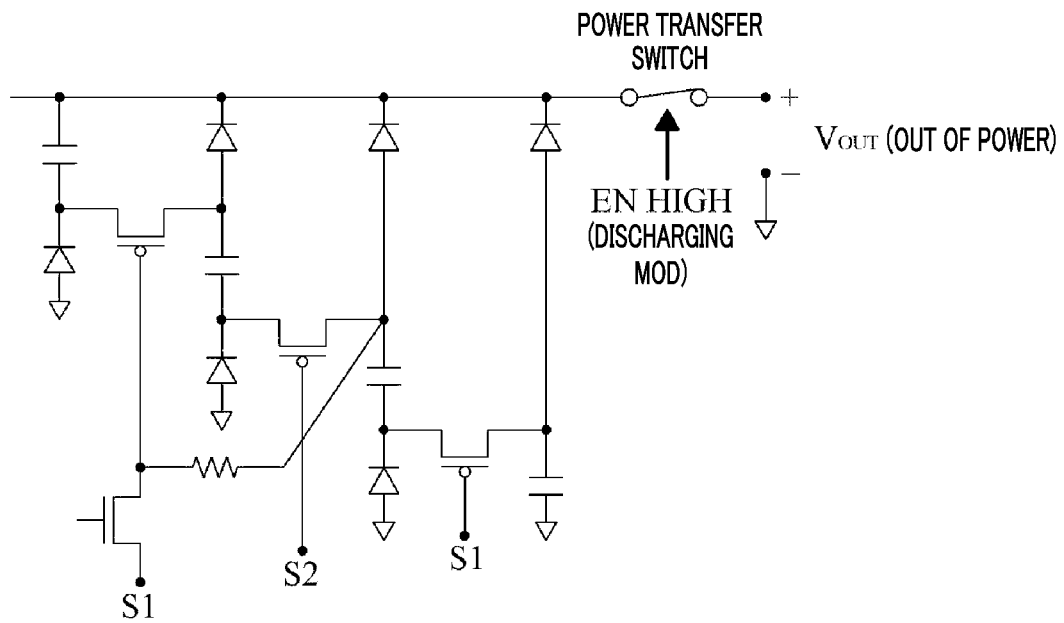
FIG. 9 is a diagram illustrating a configuration of an output waveform of the energy collecting device capable of reusing residual charges using the voltage supervisors according to the embodiment of the present invention.
Figure 9:
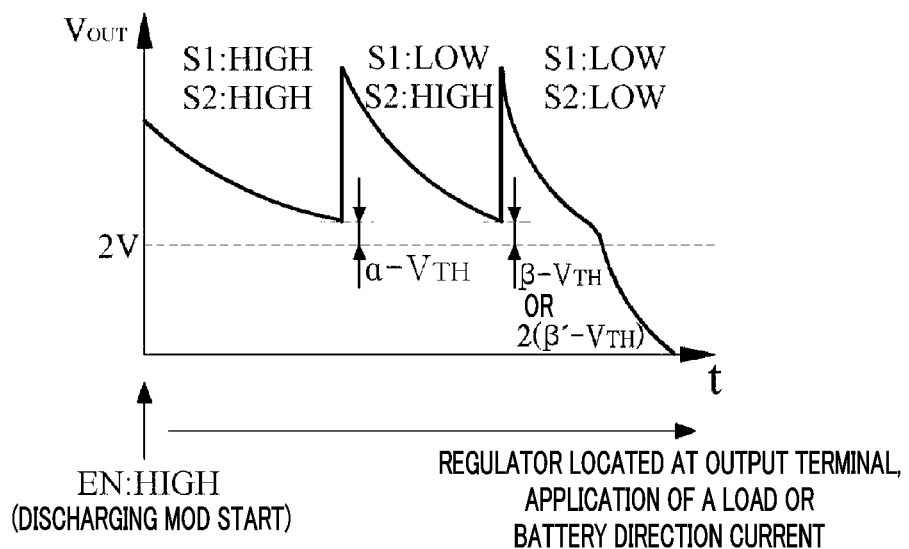

FIG. 1 is a functional block diagram illustrating a configuration of an energy collecting device capable of reusing residual charges using voltage supervisors according to an embodiment of the present invention, FIG. 2 is a diagram illustrating a circuit configuration of the energy collecting device capable of reusing residual charges using the voltage supervisors according to the embodiment of the present invention, FIG. 3 is a diagram illustrating a circuit configuration of an example of the voltage supervisor circuit applied to the energy collecting device capable of reusing residual charges using the voltage supervisors according to the embodiment of the present invention, FIG. 4A to 4B are a diagram illustrating a circuit configuration of one modification example of a charging and discharging conversion unit applied to the energy collecting device capable of reusing residual charges using the voltage supervisors according to the embodiment of the present invention, FIG. 5A to 5B are a diagram illustrating a circuit configuration of another modification example of the charging and discharging conversion unit applied to the energy collecting device capable of reusing residual charges using the voltage supervisors according to the embodiment of the present invention, FIG. 6A to 6C is a diagram illustrating a connection state of a capacitor array provided in the charging and discharging conversion unit applied to the energy collecting device capable of reusing residual charges using the voltage supervisors according to the embodiment of the present invention, FIG. 7 is a diagram illustrating an example of a configuration of a control signal bridge unit applied to the energy collecting device capable of reusing residual charges using the voltage supervisors according to the embodiment of the present invention, FIG. 8A to 8C is a diagram illustrating an example of a method of generating a discharging mode switch signal of the energy collecting device capable of reusing residual charges using the voltage supervisors according to the embodiment of the present invention, and FIG. 9 is a diagram illustrating a configuration of an output waveform of the energy collecting device capable of reusing residual charges using the voltage supervisors according to the embodiment of the present invention. As illustrated in FIG. 1 and FIG. 2, an energy collecting device 100 capable of reusing residual charges using voltage supervisors according to the embodiment of the present invention includes a piezoelectric element unit 110, a rectification unit 120, a charging and discharging conversion unit 130, a power transfer switching unit 140, a regulator 150, and a voltage monitoring unit 160.

The piezoelectric element unit 110 is configured to generate an alternating current according to a pressing operation of a user. The piezoelectric element unit 110 converts a pressure applied dynamically into a voltage and generates the alternating current according to the pressing operation of the user on the piezoelectric element unit 110 and outputs the alternating current. Here, since a configuration of the piezoelectric element unit 110 corresponds to a general configuration, unnecessary description thereof will be omitted.

The rectification unit 120 is configured to rectify the alternating current generated from the piezoelectric element unit 110 into a direct current and output the direct current. The rectification unit 120 can be configured with a bridge diode (BD) including four diodes.

The charging and discharging conversion unit 130 has a configuration which includes a plurality of capacitors and a plurality of switching elements for charging and discharging an output voltage output from the rectification unit 120, converts a connection state of the plurality of capacitors into a series connection state or a parallel connection state depending on switching of the plurality of switching elements, and adjusts charging and discharging of energy. In the charging and discharging conversion unit 130, all the plurality of capacitors can be connected in series on the basis of a switching control signal of at least one voltage supervisor circuit of the voltage monitoring unit 160 which will be described below in a charging mode of the plurality of capacitors, and in a discharging mode of the plurality of capacitors, the connection states of the plurality of capacitors can be converted and connected in the order of an entire parallel connection, a partial series connection, and an entire series connection, based on the switching control signals of the plurality of voltage supervisor circuits of the voltage monitoring unit 160 corresponding to a drive voltage for a load to operate.

Here, the charging and discharging conversion unit 130 can be configured to increase the plurality of capacitors by a multiple of 2. At this time, a configuration of a diode and a switch can be increased according to an increase of the plurality of capacitors.

Further, as illustrated in FIG. 2, the charging and discharging conversion unit 130 can be configured to include first to fourth capacitors C1 to C4 connected in parallel to an output terminal of the rectification unit 120, first to third diodes D1 to D3 which is interposed between the second to fourth capacitors C2 to C4 connected in parallel to the output terminal of the rectification unit 120 and the output terminal of the rectification unit 120 respectively and are connected in series to the second to fourth capacitors C2 to C4 respectively, a first switching element M1 which is connected to a connection node between the other terminal of the first capacitor C1 and the fourth diode D4 which are connected in series and is connected to a connection node between the first diode D1 and the second capacitor C2 and is switched according to a first switching control signal S1 of the voltage monitoring unit 160, a second switching element M2 which is connected to a connection node between the other terminal of the second capacitor C2 and the fifth diode D5 which are connected in series and is connected to a connection node between the second diode D2 and the third capacitor C3 and is switched according to a second switching control signal S2 of the voltage monitoring unit 160, a third switching element M3 which is connected to a connection node between the other terminal of the third capacitor C3 and the sixth diode D6 which are connected in series and is connected to a connection node between the third diode D3 and the fourth capacitor C4 and is switched according to the first switching control signal S1 of the voltage monitoring unit 160, and a circuit which includes a control signal bridge unit BU connected to a gate terminal of the first switching element M1 and a resistor R connected to a connection node between the first switching element M1 and the control signal bridge unit BU and a connection node between the second diode D2 and the third capacitor C3. Here, the resistor R is a very large resistor having a value of several mega ohms, and there is almost no power consumption due to a current flowing through the resistor, and the resistor R functions to hold a basic bias voltage of a gate of each switching element.

Further, each of the first to third switching elements M1 to M3 included in the charging and discharging conversion unit 130 can be configured with a MOSFET (Metal-Oxide Semiconductor Field Effect Transistor) and can be configured with any one of a P-ch MOSFET or an N-ch MOSFET.

The power transfer switching unit 140 is configured to be connected to an output terminal of the charging and discharging conversion unit 130 and switched to a discharging mode according to a discharging mode switch signal EN. The power transfer switching unit 140 is turned off in a charging mode of the charging and discharging conversion unit 130 and turned on in a discharging mode of the charging and discharging conversion unit 130 so as to serve to transfer the power output from a capacitor array of the charging and discharging conversion unit 130 to a load 10 via the regulator 150 of the rear stage. Here, as illustrated in FIG. 8A to 8C, the discharging mode switch signal EN can be realized by any one of an input terminal and an output terminal of the regulator 150 which will be described later, an application of the load 10, and an additional voltage supervisor circuit V_S that monitors a voltage of the fourth capacitor C4 of the charging and discharging conversion unit 130 to a low threshold.

The regulator 150 is configured to convert an output voltage transferred in a switching state of the discharging mode of the power transfer switching unit 140 and output the converted voltage to the load 10. The regulator 150 functions to adjust the voltage of the charging and discharging conversion unit 130 transferred through the power transfer switching unit 140 as a drive voltage required for driving the load 10 and output the adjusted voltage.

The voltage monitoring unit 160 is configured to include a plurality of voltage supervisor circuits, each controlling switching of the plurality of switching elements in order to adjust charging and discharging of the plurality of capacitors included in the charging and discharging conversion unit 130, monitoring an predetermined internal voltage of the charging and discharging conversion unit 130, and outputting a switching control signal based on the predetermined voltage to be monitored. As illustrated in FIG. 2, the voltage monitoring unit 160 can be configured to include a first voltage supervisor circuit V_S_1/161 that monitors a voltage state of a connection node point $V_{C4P}$, which is connected to the third switching element M3, between the third diode D3 and the fourth capacitor C4 and outputs the first switching control signal S1 to the first switch M1 and the third switch M3 on the basis of the monitored voltage state, and a second voltage supervisor circuit V_S_2/162 that monitors a voltage state of a connection node point $V_{C3P}$, which is connected to the second switching element M2, between the second diode D2 and the third capacitor C3 and outputs the second switching control signal S2 to the second switch M2 on the basis of the monitored voltage state.

Further, in the voltage monitoring unit 160, the first and second voltage supervisor circuits 161 and 162 output the first and second switching control signals S1 and S2 for switching control of the first to third switching elements M1 to M3 respectively, and the first and second switching control signals S_1 and S2 can function to prevent the switching elements from being damaged as control signals having no great difference from each gate voltage and each drain voltage of the first to third switching elements M1 to M3. That is, since a voltage of several tens of volts generated by the piezoelectric element unit 110 is accumulated in the first to third switching elements M1 to M3 of the charging and discharging conversion unit 130, in a case where an appropriate gate voltage is not provided thereto, gate terminals of the switching elements can be damaged. In order to prevent the gate terminals of the switching elements from being damaged, the first and second voltage supervisor circuits 161 and 162 generate the switching control signal such that each gate voltage has no great difference from the drain voltage.

Further, since each of the first and second voltage supervisor circuits 161 and 162 of the voltage monitoring unit 160 is configured to generate the first and second switching control signals S1 and S2 based on an predetermined internal voltage monitored by the charging and discharging conversion unit 130, the first and second voltage supervisor circuits are insensitive to timing, thereby, being able to function to enable a reliable circuit operation. This can be configured by a circuit of which cost of a circuit hardware is not high and can be configured with a low-use commercial device, thereby, enabling a low-cost implementation.

An operation process of the energy collecting device capable of reusing residual charges using the voltage supervisors according to the embodiment of the present invention will be described in detail with reference to FIG. 2.

First, in a case where no voltage is charged in an array of the first to fourth capacitors C1 to C4 of the charging and discharging conversion unit 130 at an initiatory stage, the discharging mode switch signal (EN signal) is maintained in a LOW state and the power transfer switching unit 140 is maintained in an open off state. Meanwhile, in a case where electric charges are charged by the piezoelectric element unit 110, the first to third switching elements M1 to M3 are turned off, and thereby, the first to fourth capacitors C1 to C4 of the charging and discharging conversion unit 130 are connected in series and charged. At this time, capacitance viewed from the piezoelectric element unit 110 toward the array of the first to fourth capacitors C1 to C4 is C/4 and is matched with impedance of the piezoelectric element unit 110, and thus, a transmission efficiency of electric energy of the piezoelectric element unit 110 to the charging and discharging conversion unit 130 is maximized. Here, C denotes capacitance of each of the first to fourth capacitors C1 to C4.

Next, while the voltage monitoring unit 160 monitors the voltages $V_{C4P}$ and $V_{C3P}$, after the voltages exceed a predetermined voltage threshold, the first and second switching control signals S1 and S2 are changed to HIGH after a predetermined delay time. Subsequently, if the array of the first to fourth capacitors C1 to C4 is sufficiently charged, the discharging mode switching signal EN is changed to HIGH, and thereby, the power transfer switching unit 140 is turned on to be changed to the discharging mode. At this time, V_{C1N, C2N, C3N} are all decreased to approximately 0 V (exactly 0 [turn-on threshold voltage of diode]), and the first to fourth capacitors C1 to C4 are connected in parallel.

Accordingly, since the switching control signals S1 and S2 are HIGH and the first to third switching elements M1 to M3 are still off, even if V_{C1N, C2N, C3N} are all 0 V, the current does not flow in the direction of $V_{C2P}$--->$V_{C1N}$, $V_{C3P}$--->$V_{C2N}$, and $V_{C4P}$--->$V_{C3N}$. Further, the first to fourth capacitors C1 to C4 connected in parallel become capacitances of 4 C in total, thereby, being able to be supplied for a long time at a voltage corresponding to a drive voltage of an application of the load 10 as a large capacitance. Here, a minimum drive voltage of the application of the regulator 150 or the load 10 is assumed to be 2 V.

Meanwhile, in a case where internal voltages of the array of the first to fourth capacitors C1 to C4 devreses near a minimum drive voltage (for example, 2 V) by discharging, the first switching control signal S1 changes to LOW. This is because the first voltage supervisor circuit 161 immediately changes the first switching control signal S1 to a LOW state if the $V_{C4P}$ decreases below a voltage of $\{2+\alpha\}$ V. In this respect, $V_{M1}$ and $V_{M3}$ connected thereto decrease to 0 V to turn on the first and third switching elements M1 and M3 of the P-ch MOSFET. That is, the first and second capacitors C1 and C2 and the third and fourth capacitors C3 and C4 are partially connected in series, and thereby, $V_{C1P}$ and $V_{C3P}$ can be increased to twice the minimum drive voltage of 2V.

Next, in a case where the discharging mode is continued and the voltages of the first and second capacitors C1 and C2 and the third and fourth capacitors C3 and C4 in the partial series connection state are close to 2V, the second switching control signal S2 changes to LOW in this time. The reason is that if $V_{C3P}$ decreases below a voltage of $\{2+\beta\}$ V (or if a voltage difference between $V_{C3P}$ and $V_{C3N}$ decreases below a voltage of $\{1+\beta'\}$V), the second voltage supervisor circuit 162 changes the second switching control signal S2 to the LOW state immediately according to this. Accordingly, $V_{M2}$ decreases to a voltage lower than $V_{C2N}$, and thereby, the second switching element M2 is turned on. That is, all the first to fourth capacitors C1 to C4 are connected in series, and VC1P is increased by twice the minimum drive voltage of 2 V. Here, the MOSFET of the charging and discharging conversion unit 130 can be configured by an N-ch MOSFET to use an active high voltage supervisor.

FIG. 3 illustrates a circuit configuration of an example of a voltage supervisor circuit applied to the energy collecting device capable of reusing residual charges using the voltage supervisors according to the embodiment of the present invention. As illustrated in FIG. 3, the voltage supervisor V_S has a frequently used general circuit configuration and has a configuration of a commercial device that is frequently used for POR (power of reset) in particular. That is, when a drive voltage is supplied to an electronic application such as a CPU and it is determined that the voltage is sufficiently stabilized, the voltage supervisor V_S releases a reset signal to drive an operation of the electronic application.

As illustrated in FIG. 3, while monitoring a $V_{DD}$ voltage, the voltage supervisor V_S compares the voltage with a reference voltage Vref corresponding to a threshold voltage $V_{th}$ of the voltage supervisor and serves to determine whether or not to output the $V_{DD}$ voltage or a $V_{SS}$ voltage after a predetermined delay time. That is, if $V_{DD}$ is greater than $V_{th}$, an output of the voltage supervisor increases to HIGH after the predetermined delay time, and if $V_{DD}$ is lower than $V_{th}$, the output of the voltage supervisor decreases to LOW immediately without delay. At this time, it can be understood that the delay time or the $V_{th}$ value of the voltage supervisor is set previously by programming. That is, the delay time of the voltage supervisor V_S can be set previously as a time taken until the energy is sufficiently charged by the piezoelectric element unit 110.

FIG. 4A to 4B illustrates a circuit configuration of a modification example of the charging and discharging conversion unit applied to the energy collecting device capable of reusing residual charges using the voltage supervisors according to the embodiment of the present invention. FIG. 4A to 4B illustrates a case where the capacitors of the charging and discharging conversion unit 130 are increased to six capacitors, and a minimum drive voltage of the regulator or the load electronic application is assumed to be 3 V, and a basic operation principle is similar to or the same as the configuration to which the four capacitors of FIG. 2 are applied, which is described in detail above. However, the configuration of the modification example of FIG. 4A to 4B differs only in which switching element the control signal bridge unit BU is connected to and where the voltage supervisor circuit is connected. That is, since voltages VC6P and VC4P of the parts connected in partial series from the capacitor close to the ground voltage (0 V) are monitored by the voltage supervisor and the control signal bridge unit BU has to be changed to be connected in series at the same timing, the MOSFET switches whose gate drive voltage levels has to be different from each other, that is the first voltage supervisor circuit 161 is connected to the first switching element M1, the second switching element M2, the fourth switching element M4, and the fifth switching element M5, and the second voltage supervisor circuit 162 is connected to the third switching element M3. Further, the first and second switching control signals generated by the first and second voltage supervisor circuits 161 and 162, that is, the output signals are connected to gates of adjacent MOSFET switches, and the control signal bridge unit BU is connected to the MOSFET switch (M1, M2, M4, M5 in a case of V_S_1, and M3 in a case of V_S_2) that has to be driven at the same timing so as to transfer the first and second switching control signals S1 and S2. Further, in an alternative embodiment, the third control signal bridge unit BU of FIG. 4A may be connected between the third switching element M3 and a node VC5P, instead of between the fourth switching element M4 and a node VC6P. In the embodiment of FIG. 4A, the HIGH control signals S1, S2, and S3 sequentially decrease to LOW, and thus the capacitors are changed to the partial series connection or the entire series connection like as FIG. 6B. When the HIGH control signal S1 decreases to LOW, two capacitor groups of which each includes three capacitors in series may be connected in parallel. In the alternative embodiment, when the HIGH control signals S1 and S2 are provided and the HIGH control signal S decreases to LOW, three capacitor groups of which each includes two capacitors in series may be connected in parallel. A structure of the three capacitor groups in parallel may operate in a lower voltage region than that of the two capacitor groups in parallel and use residual charges more easily. Thus residual charges can be used more effectively.

FIG. 5A to 5B illustrates a circuit configuration of another modification example of the charging and discharging conversion unit applied to the energy collecting device capable of reusing residual charges using the voltage supervisors according to the embodiment of the present invention. FIG. 5A to 5B are a configuration of an example in which the number of capacitors is increased to eight on the basis of the charging and discharging conversion unit 130 of FIG. 2. It is a case where an operation principle is basically the same as the configuration of FIG. 2 and a minimum drive voltage of a regulator or a load electronic application is assumed to be 4V. That is, FIG. 5A to 5B differs only in that one more partial series conversion process is added and differs only in a configuration in which the voltage supervisor circuit 163 is further added to the voltage monitoring unit 160 of the charging and discharging conversion unit 130. Further, which switch the control signal bridge unit BU is attached to and where the voltage supervisor is installed are applied in the same manner as described with reference to FIG. 4A to 4B.

FIG. 6A to 6C illustrates a connection state of a capacitor array included in the charging and discharging conversion unit applied to the energy collecting device capable of reusing residual charges using the voltage supervisors according to the embodiment of the present invention. FIG. 6A illustrates a connection state of charging and discharging for four capacitors, FIG. 6B illustrates the connection state of charging and discharging for six capacitors, and FIG. 6C illustrates the connection state of charging and discharging for eight capacitors. That is, charging is performed in entire series and impedance matching with a piezoelectric element is made to receive energy with maximum efficiency, and if the discharging mode switch signal EN is changed to HIGH, the entire parallel connection is made to divide the high voltage accumulated in series by N, and the capacitance is multiplied by N to supply energy to the load. If the voltage decreases near a predetermined minimum supply voltage, the HIGH control signals S1, S2, and S3 sequentially decrease to LOW, and the capacitors are changed to the partial series connection or the entire series connection. In a charging and discharging conversion method according to the present invention, in a case where the capacitor array is all connected in parallel because the energy charging by the piezoelectric element is insufficient, that is, in a case where the capacitor voltage is lower than the minimum drive voltage, the capacitor array is immediately changed to the partial series mode without going through the entire parallel mode, and thus, the drive voltage level can be satisfied.

FIG. 7 illustrates an example of a configuration of the control signal bridge unit applied to the energy collecting device capable of reusing residual charges using voltage supervisors according to the embodiment of the present invention. As illustrated in FIG. 7, the control signal bridge unit BU is a portion of a circuit denoted by dark color, is connected to a gate of $M_n$ and a point P of V_C{n+2}, and is a unit circuit that is controlled by control signals EN and $S_k$. Here n=1, 2, . . . , [total number of capacitors], k=1, 2, ---, [total number of control signals]. That is, the corresponding unit circuit can operate stably without a separate circuit such as a voltage level shifter even if a voltage level of $S_k$ does not match the point P of V_CnN or V_C{n+1}.

In a method of operating the control signal bridge unit, if the signal EN for changing to the discharging mode goes to HIGH, $S_k$ is directly connected to the gate of $M_n$, and the control signal bridge unit BU protects a gate of $M_n$ by preventing $S_k$ from being applied to $M_n$ when EN is in a LOW state (charging mode). In a case where $S_k$ is directly connected to the gate of $M_n$ without the control signal bridge unit BU, if $S_k$ is in the LOW state in the charging mode, a gate voltage of $M_n$ decreases to a voltage much lower than the point P of V_CnN or V_C{n+1} charged with several tens volts, and thereby, there is a risk that the gate of $M_n$ is damaged. Further, even if the gate of $M_n$ is not damaged, $M_n$ is always on even if $S_k$ is changed to HIGH because a voltage level of $S_k$ does not match the point P of V_CnN or V_C{n+1}, and thus, Even if the mode is changed to the discharging mode, the capacitors are all connected in series, resulting in a very poor stability and efficiency in energy transfer to the load.

FIG. 8A to 8C illustrates an example of a method of generating a discharging mode change signal of the energy collecting device capable of reusing residual charges using the voltage supervisors according to the embodiment of the present invention. FIG. 8A illustrates a method of using an energy harvester output voltage, and an N-ch MOSFET of a bold color connected to a gate of the power transfer switching unit 140 is controlled by selecting one of the switching control signals $S_k$ (k=1, 2, . . . , [total number of control signals]) generated by the charging and discharging conversion unit 130. That is, if the charging and discharging conversion unit 130 is sufficiently charged, $S_k$ will be in a HIGH state, and thus, the power transfer switching unit 140 is closed and an output voltage is transferred to a regulator or a DC-DC converter.

If the output voltage generated at this time is used as the signal EN, the signal EN is maintained to HIGH until the output voltage is exhausted, and the power transfer switching unit 140 can also be maintained in the turn-on state. At this time, the signal EN can be extracted from an input terminal or an output terminal of the regulator or the DC-DC converter. FIG. 8B illustrates a method of generating a digital control signal in a load application, and illustrates a method in which when $S_k$ goes to HIGH in the discharging mode, the signal is input to a load application and a digital circuit provides the discharging mode change signal EN. Particularly, in a case where there are a battery and an auxiliary power supply, a triggering N-ch MOSFET illustrated in FIG. 8A may not be used, and in a case where there is no auxiliary power supply, the N-ch MOSFET illustrated in FIG. 8A may be used. FIG. 8C illustrates a method of using an output signal of the voltage supervisor having a low threshold, a voltage $V_{c4p}$ of the capacitor C4 closest to the ground among the capacitors of the charging and discharging conversion unit 130 is monitored by the voltage supervisor V_S having a low threshold, and a delay time of the voltage supervisor is set to be longer than the delay times of the added voltage supervisors that generate the switching control signals S1, S2, . . . . At this time, an output of the additionally installed voltage supervisor V_S can be used as the discharging mode change signal EN.

FIG. 9 illustrates a configuration of an output waveform of the energy collecting device capable of reusing residual charges using the voltage supervisors according to the embodiment of the present invention. FIG. 9 illustrates an example of the output waveform for FIG. 2 configured by a four-capacitor structure. As illustrated in FIG. 9, if the power transfer switching unit 140 is turned ON (EN HIGH; discharging mode) to enable a current to flow toward the load, a voltage charged in the four-capacitor array slowly decreases as illustrated in a graph in a lower portion of FIG. 9. That is, an electrical energy charged in the four capacitors flows toward the load. Accordingly, the voltage is reduced as illustrated in the first graph in the lower portion of FIG. 9. At this time, if an output S of the voltage supervisor changes to a LOW state, the capacitors are paired with each other to change to a partial series state, and thereby, the voltage increases again (approximately 2 times to 4 V). Subsequently, the output voltage decreases again according to the continuous current output, but if the output voltage changes to a LOW state until S2, the voltage increases again, and thus, all the residual charges can be used in this manner. As illustrated in FIG. 9, α, β, and β' are margins existing in the first and second voltage supervisor circuits 161 and 162 of the voltage monitoring unit 160 of FIG. 2, and $V_{TH}$ is approximately 0.3 V to 0.8 V as a diode threshold voltage (turn on threshold voltage) of the charging and discharging conversion unit 130. That is, since the reason why the margins such as α, β, and β' have to exist in the first and second voltage supervisor circuits 161 and 162 of the voltage monitoring unit 160 in FIG. 2 is that there is $V_{TH}$, the threshold margin of the voltage supervisor V_S to offset this has to exist to secure a minimum drive voltage. Accordingly, FIG. 9 illustrates "β–$V_{TH}$ or 2*(β'–$V_{TH}$)", and a case of 2*(β'–$V_{TH}$) corresponds to a case of a configuration of the voltage supervisor V_S corresponding to "or" of FIG. 2. Accordingly, (β'–$V_{TH}$) is multiplied by 2, and the reason is that since a voltage of C3 connected in series to C4 is monitored as can be seen in the configuration of the voltage supervisor V_S corresponding to "or" of FIG. 2, the voltage supervisor V_S has $V_{th}$ near 1V which is half of 2 V (exactly 1+3'V). If the residual charge reuse structure is not used as in the present invention, the discharging mode of the charging and discharging conversion unit 130 is released immediately when the voltage is reduced to be lower than or equal to 2 V after passing through only the first portion (sections marked as S1: HIGH and S2: HIGH) on the voltage graph of FIG. 9, and thus, energy efficiency is significantly lowered compared to the residual charge reuse structure.

As described above, in an energy collecting device capable of reusing residual charges using voltage supervisors according to an embodiment of the present invention, an predetermined internal voltage of a charging and discharging conversion unit is monitored by using voltage supervisor circuits of a voltage monitoring unit in response to a drive voltage for a load to operate such that a connection state of a plurality of capacitors included in the charging and discharging conversion unit is converted to a series connection or a parallel connection in a charging mode or a discharging mode, switching of switching elements of the charging and discharging conversion unit is controlled through switching control signals generated corresponding thereto, and thereby, the plurality of capacitors of the charging and discharging conversion unit are connected in series in the charging mode, and the connection state of the plurality of capacitors is converted and connected in the order of an entire parallel connection, a partial series connection, and an entire series connection in response to the drive voltage for the load to be driven in the discharging mode, and thus, residual charges in each capacitor can be reused to the maximum in response to the drive voltage of the load. Further, the residual charges in each capacitor can be reused as the drive voltage for the load to be driven to the maximum by switching and converting a series or parallel connection state of the plurality of capacitors of the charging and discharging conversion unit on the basis of a predetermined voltage monitored by a voltage supervisor in response to the drive voltage for the load to operate, and thus, it is possible to improve use of electric charges that cannot be used due to not being appropriate for the drive voltage of the load and to enable a long term use. Particularly, by controlling switching of the switching elements by monitoring an predetermined internal voltage of the charging and discharging conversion unit by using the voltage supervisors circuit of the voltage monitoring unit, it is possible to prevent the switching elements to be damaged, to enable a reliable circuit operation due to insensitivity to timing of the switching control, to configure a circuit with small hardware costs of a configuration circuit, and to enable low costs because a low-cost commercial device can be configured.

The present invention described above can be variously modified or applied by those skilled in the art to which the present invention belongs, and the scope of the technical idea according to the present invention should be defined by the following claims.

What is claimed is:

1. An energy collecting device as an energy collecting device capable of reusing residual charges using voltage supervisors, comprising:
   a piezoelectric element unit that generates an alternating current according to a pressing operation of a user;
   a rectification unit that rectifies the alternating current generated from the piezoelectric element unit into a direct current and outputs the direct current;
   a charging and discharging conversion unit that includes a plurality of capacitors for charging and discharging an output voltage output from the rectification unit and a plurality of switching elements and converts a connection state of the plurality of capacitors into a series or parallel connection according to switching of the plurality of switching elements to adjust charging and discharging of energy;
   a power transfer switching unit that is connected to an output terminal of the charging and discharging conversion unit and is switched to a discharging mode according to a discharging mode switching signal EN;
   a regulator that converts an output voltage transmitted in a switching mode of the discharging mode of the power transfer switching unit and outputs the output voltage to a load; and
   a voltage monitoring unit including at least one voltage supervisor circuit that control switching of the plurality of switching elements in order to adjust charging and discharging of the plurality of capacitors included in the charging and discharging conversion unit, each monitor a predetermined internal voltage of the charging and discharging conversion unit, and each output switching control signals on the basis of the monitored predetermined voltage,
   wherein, in a charging mode of the plurality of capacitors, all the plurality of capacitors are connected in series on the basis of the switching control signals of the at least one voltage supervisor circuit of the voltage monitoring unit and
   in the discharging mode of the plurality of capacitors, the connection state of the plurality of capacitors is converted and connected in one of an entire parallel connection, a partial series connection, and an entire series connection on the basis of the switching control signals of the at least one voltage supervisor circuit of the voltage monitoring unit corresponding to a drive voltage for the load to operate.

2. The energy collecting device capable of reusing residual charges using the voltage supervisors according to claim 1, wherein the charging and discharging conversion unit is configured to increase the plurality of capacitors by a multiple of 2.

3. The energy collecting device capable of reusing residual charges using the voltage supervisors according to claim 1, wherein the charging and discharging conversion unit is configured to include
   first to fourth capacitors C1 to C4 connected in parallel to an output terminal of the rectification unit;
   first to third diodes D1 to D3 that are interposed between the output terminal of the rectification unit and the second to fourth capacitors C2 to C4 respectively connected in parallel to the output terminal of the rectification unit and are connected in series to the second and fourth capacitors C2 to C4 respectively;

a first switching element M1 that is connected to a connection node between the other terminal of the first capacitor C1 and a fourth diode D4 connected in series to the other terminal of the first capacitor C1 and a connection node between the first diode D1 and the second capacitor C2, and is switched according to a first switching control signal S_1 of the voltage monitoring unit;

a second switching element M2 that is connected to a connection node between the other terminal of the second capacitor C2 and a fifth diode D5 connected in series to the other terminal of the first capacitor C1 and a connection node between the second diode D2 and the third capacitor C3, and is switched according to a second switching control signal S2 of the voltage monitoring unit;

a third switching element M3 that is connected to a connection node between the other terminal of the third capacitor C3 and a sixth diode D6 connected in series to the other terminal of the third capacitor C3 and a connection node between the third diode D3 and the fourth capacitor C4, and is switched according to the first switching control signal S_1 of the voltage monitoring unit; and a control signal bridge unit BU connected to a gate terminal of the first switching element M1;

wherein the control signal bridge unit BU includes a resistor R that is connected to a node connected to the gate terminal of the first switching element M1 and a connection node between the second diode D2 and the third capacitor C3.

4. The energy collecting device capable of reusing residual charges using the voltage supervisors according to claim 3, wherein each of the first to third switching elements M1 to M3 is configured with a MOSFET (Metal-Oxide Semiconductor Field Effect Transistor and is configured with one of a P-ch MOSFET and an N-ch MOSFET.

5. The energy collecting device capable of reusing residual charges using the voltage supervisors according to claim 3, wherein the voltage monitoring unit is configured to include a first voltage supervisor circuit V_S_1 that monitors a voltage state of a connection node point $V_{C4P}$, which is connected to the third switching element M3, between the third diode D3 and the fourth capacitor C4 and outputs the first switching control signal S1 to the first switching element M1 and the third switching element M3 on the basis of the monitored voltage state; and a second voltage supervisor circuit V_S_2 that monitors a voltage state of a connection node point $V_{C3P}$, which is connected to the second switching element M2, between the second diode D2 and the third capacitor C3 and outputs the second switching control signal S2 to the second switching element M2 on the basis of the monitored voltage state.

6. The energy collecting device capable of reusing residual charges using the voltage supervisors according to claim 5, wherein in the voltage monitoring unit, the first and second voltage supervisor circuits output first and second switching control signals S1 and S2 for switching control of the first to third switching elements M1 to M3, respectively, and the first and second switching control signals S1 and S2 are control signals having no great difference from each gate voltage and each drain voltage of the first to third switching elements M1 to M3 and function to prevent the switching elements from being damaged.

7. The energy collecting device capable of reusing residual charges using the voltage supervisors according to claim 6, wherein the first and second voltage supervisor circuits of the voltage monitoring unit are configured to generate the first and second signals S1 and S2 respectively on the basis of an predetermined internal voltage monitored by the charging and discharging conversion unit and function to be capable of a reliable circuit operation due to insensitivity to timing.

8. The energy collecting device capable of reusing residual charges using the voltage supervisors according to claim 5, wherein the discharging mode switching signal EN is realized by one of an input terminal and an output terminal of the regulator, an application of a load, and an output of an additional voltage supervisor circuit that monitors a voltage of the fourth capacitor C4 of the charging and discharging conversion unit to a low threshold.

9. The energy collecting device capable of reusing residual charges using the voltage supervisors according to claim 1, wherein the charging and discharging conversion unit is configured to include a first switching element M1 that is switched according to a first switching control signal S of the voltage monitoring unit;

a second switching element M2 that is connected to a connection node between the other terminal of the second capacitor C2 and an terminal of the third capacitor C3, and is switched according to a second switching control signal S2 of the voltage monitoring unit;

a third switching element M3 that is connected to a connection node between the other terminal of the third capacitor C3 and an terminal of the fourth capacitor C4, and is switched according to the first switching control signal S of the voltage monitoring unit; and a control signal bridge unit BU that is connected to a gate terminal of the first switching element M1 for transferring the first switching control signal S1 and includes a resistor R that is connected to a connection node between a gate terminal of the first switching element M1 and an terminal of the third capacitor C3, wherein the resistor R makes a voltage of an terminal of the third capacitor C3 be identical with a basic bias voltage of the gate terminal of the first switching element M1.

10. The energy collecting device capable of reusing residual charges using the voltage supervisors according to claim 1, wherein, in the discharging mode of the plurality of capacitors, the connection state of the plurality of capacitors is converted and connected in an order of an entire parallel connection, a partial series connection, and an entire series connection on the basis of the switching control signals of the at least one voltage supervisor circuit of the voltage monitoring unit corresponding to a drive voltage for the load to operate.

* * * * *